(12) United States Patent
Chen et al.

(10) Patent No.: US 9,842,758 B2
(45) Date of Patent: Dec. 12, 2017

(54) PACKAGE STRUCTURE AND FABRICATION METHOD THEREOF

(71) Applicant: Siliconware Precision Industries Co., Ltd., Taichung (TW)

(72) Inventors: Yan-Heng Chen, Taichung (TW); Chun-Tang Lin, Taichung (TW); Chieh-Yuan Chi, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/836,613

(22) Filed: Aug. 26, 2015

(65) Prior Publication Data

US 2016/0126126 A1    May 5, 2016

(30) Foreign Application Priority Data

Nov. 3, 2014    (TW) .............................. 103138012 A

(51) Int. Cl.
| | |
|---|---|
| *H01L 21/00* | (2006.01) |
| *H01L 21/683* | (2006.01) |
| *H01L 23/00* | (2006.01) |
| *H01L 21/56* | (2006.01) |

(Continued)

(52) U.S. Cl.
CPC .......... *H01L 21/6835* (2013.01); *H01L 24/19* (2013.01); *H01L 21/568* (2013.01); *H01L 23/295* (2013.01); *H01L 25/105* (2013.01); *H01L 2221/68318* (2013.01); *H01L 2221/68359* (2013.01); *H01L 2221/68368* (2013.01); *H01L 2221/68372* (2013.01); *H01L 2224/04105* (2013.01); *H01L 2224/12105* (2013.01);

(Continued)

(58) Field of Classification Search
CPC ........................... H01L 21/6835; H01L 24/19; H01L 21/76877
See application file for complete search history.

(56) References Cited

U.S. PATENT DOCUMENTS

| | | | |
|---|---|---|---|
| 6,372,619 B1 * | 4/2002 | Huang ................ | H01L 23/3114 257/E21.508 |
| 6,440,835 B1 * | 8/2002 | Lin ........................ | H01L 24/11 257/E21.508 |

(Continued)

*Primary Examiner* — Laura Menz
(74) *Attorney, Agent, or Firm* — Mintz Levin Cohn Ferris Glovsky and Popeo, P.C.; Peter F. Corless; Steven M. Jensen

(57) ABSTRACT

A method for fabricating a package structure is provided, including the steps of: disposing on a carrier a semiconductor chip having an active surface facing the carrier; forming a patterned resist layer on the carrier; forming on the carrier an encapsulant exposing an inactive surface of the semiconductor chip and a surface of the patterned resist layer; and removing the carrier to obtain a package structure. Thereafter, redistribution layers can be formed on the opposite sides of the package structure, and a plurality of through holes can be formed in the patterned resist layer by drilling, thus allowing a plurality of conductive through holes to be formed in the through holes for electrically connecting the redistribution layers on the opposite sides of the package structure. Therefore, the invention overcomes the conventional drawback of surface roughness of the through holes caused by direct drilling the encapsulant having filler particles.

5 Claims, 4 Drawing Sheets

(51) Int. Cl.
*H01L 23/29* (2006.01)
*H01L 25/10* (2006.01)

(52) U.S. Cl.
CPC .............. *H01L 2225/1035* (2013.01); *H01L 2225/1041* (2013.01)

(56) References Cited

U.S. PATENT DOCUMENTS

| | | | | |
|---|---|---|---|---|
| 6,908,788 B1* | 6/2005 | Lin | H01L 21/4853 | 438/106 |
| 9,659,806 B2* | 5/2017 | Chang | H01L 21/6835 | |
| 2002/0074146 A1* | 6/2002 | Okubora | H01L 21/563 | 174/521 |
| 2009/0309212 A1* | 12/2009 | Shim | H01L 21/568 | 257/700 |
| 2013/0200528 A1* | 8/2013 | Lin | H01L 21/6836 | 257/774 |
| 2013/0249589 A1* | 9/2013 | Chen | H01L 22/14 | 324/762.01 |
| 2015/0179616 A1* | 6/2015 | Lin | H01L 25/50 | 257/773 |
| 2015/0221573 A1* | 8/2015 | Paek | H01L 21/56 | 257/738 |
| 2015/0270237 A1* | 9/2015 | Chi | H01L 23/528 | 257/737 |
| 2015/0382469 A1* | 12/2015 | Hu | H01L 23/49827 | 361/761 |
| 2016/0043047 A1* | 2/2016 | Shim | H01L 21/561 | 257/773 |
| 2016/0049376 A1* | 2/2016 | Chen | H01L 21/561 | 438/106 |
| 2016/0071784 A1* | 3/2016 | Chang | H01L 21/561 | 257/774 |
| 2016/0104694 A1* | 4/2016 | Liao | H01L 24/19 | 257/774 |
| 2016/0126126 A1* | 5/2016 | Chen | H01L 21/6835 | 257/738 |
| 2016/0133551 A1* | 5/2016 | Hsiao | H01L 23/49811 | 257/737 |
| 2016/0141227 A1* | 5/2016 | Lin | H01L 23/3128 | 257/774 |
| 2016/0148873 A1* | 5/2016 | Chiang | H01L 23/15 | 257/774 |
| 2016/0190080 A1* | 6/2016 | Chen | H01L 24/13 | 257/773 |
| 2016/0190099 A1* | 6/2016 | Liu | H01L 21/6835 | 257/774 |

* cited by examiner

PACKAGE STRUCTURE AND FABRICATION METHOD THEREOF

CROSS-REFERENCES TO RELATED APPLICATIONS

This application claims under 35 U.S.C. §119(a) the benefit of Taiwanese Application No. 103138012, filed Nov. 3, 2014 the entire contents of which are incorporated herein by reference.

BACKGROUND OF THE INVENTION

1. Field of the Invention

The present invention relates to semiconductor structures and fabrication methods thereof, and more particularly, to a semiconductor package structure and a fabrication method thereof.

2. Description of Related Art

As electronic products are developed toward miniaturization, less space is available on surfaces of printed circuit boards for mounting semiconductor packages. Therefore, a 3D stacking technique is developed, which allows at least two semiconductor package to be stacked on one another to form a PoP (package on package) structure. Such a PoP structure meets the demand for high-density mounting of components of electronic products.

FIG. 1 is a schematic cross-sectional view of a conventional semiconductor package of a PoP structure. Referring to FIG. 1, a semiconductor chip 11 having opposite active and inactive surfaces is provided and an encapsulant 12 is formed around the semiconductor chip 11. A redistribution layer 13 is formed on the active surface of the semiconductor chip 11 and a circuit layer 16 is formed on the inactive surface of the semiconductor chip 11. The circuit layer 16 and the redistribution layer 13 are electrically connected through a plurality of conductive through holes 15 formed in the encapsulant 12. Further, a plurality of solder balls 14 are formed on the redistribution layer 13.

To form the conductive through holes 15 in the encapsulant 12, a laser drilling process is generally performed to form through holes in the encapsulant 12 first and then an electroplating process is performed to form the conductive through holes 15 in the through holes. However, filler particles that are usually contained in the encapsulant 12 increase surface roughness of the through holes, thereby increasing the difficulty of the electroplating process and easily resulting in electrical discontinuity. On the other hand, the size of the filler particles may be reduced to reduce the surface roughness of the through holes. But such a reduction in the size of the filler particles also reduces the strength of the package structure.

Therefore, there is a need to provide a package structure and a fabrication method thereof so as to overcome the above-described drawbacks.

SUMMARY OF THE INVENTION

In view of the above-described drawbacks, the present invention provides a method for fabricating a package structure, which comprises the steps of: disposing on a carrier at least a semiconductor chip having an active surface facing the carrier and an inactive surface opposite to the active surface; forming a patterned resist layer on the carrier; forming an encapsulant on the carrier so as to encapsulate the semiconductor chip and the patterned resist layer; thinning the encapsulant to expose the inactive surface of the semiconductor chip and a surface of the patterned resist layer; and removing the carrier.

The present invention provides another method for fabricating a package structure, which comprises the steps of: embedding a semiconductor chip and a patterned resist layer in an encapsulant, wherein the encapsulant has a surface exposing an active surface of the semiconductor chip and a first surface of the patterned resist layer, and an opposite surface exposing an inactive surface of the semiconductor chip and a second surface of the patterned resist layer; forming a first redistribution layer on the active surface of the semiconductor chip, the first surface of the patterned resist layer and the encapsulant, wherein the first redistribution layer is electrically connected to the active surface of the semiconductor chip; drilling the patterned resist layer from the second surface thereof so as to form a plurality of through holes in the patterned resist layer, wherein portions of the first redistribution layer are exposed from the through holes of the patterned resist layer; and forming a second redistribution layer on the inactive surface of the semiconductor chip, the second surface of the patterned resist layer and the encapsulant, and forming conductive through holes in the through holes of the patterned resist layer for electrically connecting the second redistribution layer to the first redistribution layer.

The present invention provides a further method for fabricating a package structure, which comprises the steps of: disposing on a first carrier at least a semiconductor chip having an active surface facing the carrier and an inactive surface opposite to the active surface; forming a patterned resist layer on the first carrier, wherein the patterned resist layer has a first surface adjacent to the first carrier and a second surface opposite to the first surface; forming an encapsulant on the first carrier so as to encapsulate the semiconductor chip and the patterned resist layer; thinning the encapsulant to expose the inactive surface of the semiconductor chip and the second surface of the patterned resist layer; disposing a second carrier on the inactive surface of the semiconductor chip, the second surface of the patterned resist layer and the encapsulant; removing the first carrier to expose the active surface of the semiconductor chip, the first surface of the patterned resist layer and the encapsulant; forming a first redistribution layer on the active surface of the semiconductor chip, the first surface of the patterned resist layer and the encapsulant, wherein the first redistribution layer is electrically connected to the active surface of the semiconductor chip; disposing a third carrier on the first redistribution layer; removing the second carrier to expose the inactive surface of the semiconductor chip, the second surface of the patterned resist layer and the encapsulant; drilling the patterned resist layer to form a plurality of through holes in the patterned resist layer, wherein portions of the first redistribution layer are exposed from the through holes of the patterned resist layer; forming a second redistribution layer on the inactive surface of the semiconductor chip, the second surface of the patterned resist layer and the encapsulant, and forming conductive through holes in the through holes of the patterned resist layer for electrically connecting the second redistribution layer to the first redistribution layer; and removing the third carrier and forming a plurality of solder balls on the first redistribution layer.

The present invention further provides a package structure, which comprises: an encapsulant; at least a semiconductor chip embedded in the encapsulant and having opposite active and inactive surfaces exposed from the encapsulant; and a patterned resist layer embedded in the encapsulant and having opposite first and second surfaces exposed from the encapsulant.

The package structure can further comprise: a plurality of conductive through holes formed in the patterned resist layer and penetrating the first and second surfaces of the patterned resist layer; a first redistribution layer formed on the active surface of the semiconductor chip, the first surface of the patterned resist layer and the encapsulant, wherein the first redistribution layer is electrically connected to the active surface of the semiconductor chip; and a second redistribution layer formed on the inactive surface of the semiconductor chip, the second surface of the patterned resist layer and the encapsulant, wherein the second redistribution layer is electrically connected to the first redistribution layer through the conductive through holes. Further, a plurality of solder balls can be formed on the first redistribution layer.

In the above-described methods and package structure, the resist layer can be a negative photoresist layer. The encapsulant can contain filler particles.

According to the present invention, the patterned resist layer is formed to partially replace the encapsulant. As such, a plurality of through holes are formed by drilling the patterned resist layer instead of the encapsulant as in the prior art. Therefore, the present invention improves the drilling effect and overcomes the conventional drawback of surface roughness of the through holes caused by filler particles of the encapsulant, thereby facilitating a subsequent electroplating process for forming the conductive through holes in the through holes and improving the electrical reliability.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "on", "a" etc. are merely for illustrative purposes and should not be construed to limit the scope of the present invention.

FIGS. 2A to 2K are schematic cross-sectional views showing a method for fabricating a package structure according to the present invention.

Figure 1:
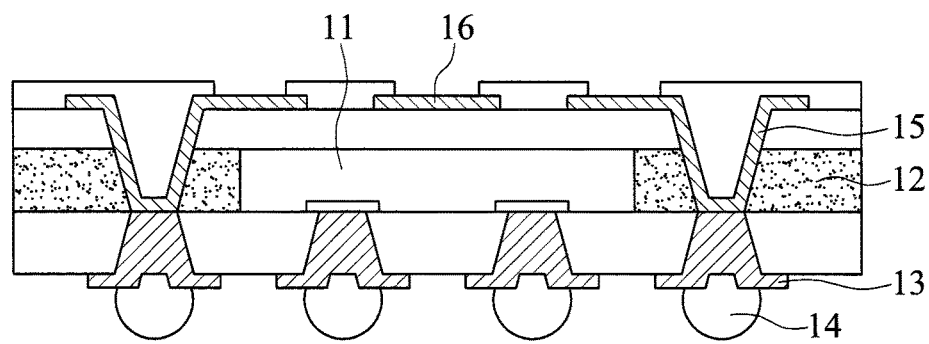
FIG. 1 is a schematic cross-sectional view of a conventional semiconductor package of a PoP structure.
Figure 2A:
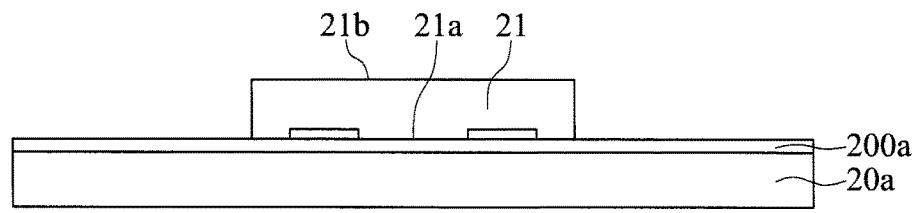
FIGS. 2A to 2K are schematic cross-sectional views showing a package structure and a fabrication method thereof according to the present invention, wherein FIG. 2E' shows another embodiment of FIG. 2E.

Referring to FIG. 2A, a first carrier 20a having a first release layer 200a formed thereon is provided. At least a semiconductor chip 21 is disposed on the first release layer 200a of the first carrier 20a. The semiconductor chip 21 has opposite active and inactive surfaces 21a, 21b and is disposed on the first release layer 200a via the active surface 21a thereof. In other words, the active surface 21a of the semiconductor chip 21 faces the first carrier 20a. The first release layer 200a is used to facilitate later removal of the first carrier 20a from the semiconductor chip 21.

Figure 2B:
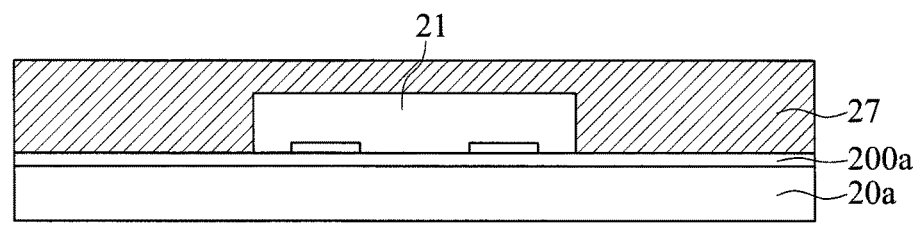
Figure 2C:
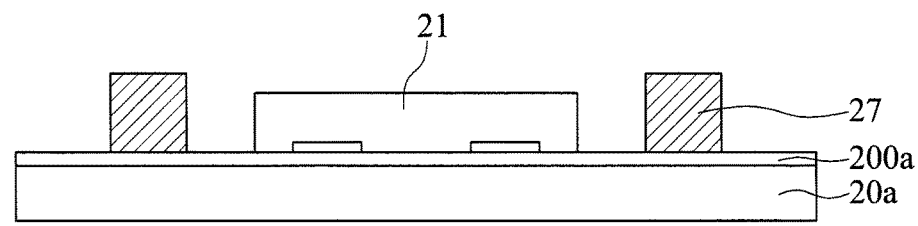

Referring to FIGS. 2B and 2C, a resist layer 27 made of such as a photoresist material is formed on and covers the first carrier 20a and the semiconductor chip 21. Then, the resist layer 27 is patterned to expose the semiconductor chip 21 and portions of the first release layer 200a. Preferably, the resist layer 27 is a negative photoresist layer.

Figure 2D:
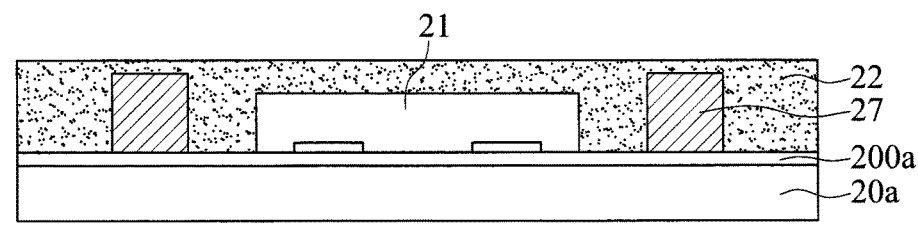

Referring to FIG. 2D, an encapsulant 22 is formed on the first carrier 20a to encapsulate the semiconductor chip 21 and the patterned resist layer 27. The encapsulant 22 contains filler particles. The size of the filler particles is large enough to provide sufficient structural strength.

Figure 2E:
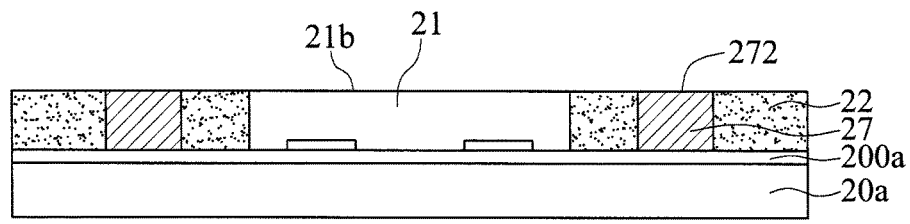
Figure 2E:
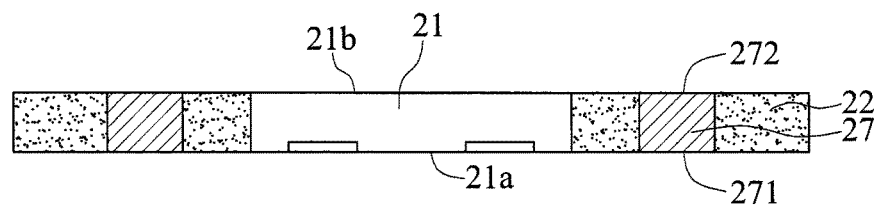

Referring to FIG. 2E, the encapsulant 22 is thinned by grinding or cutting to expose the inactive surface 21b of the semiconductor chip 21 and a second surface 272 of the patterned resist layer 27. The inactive surface 21b of the semiconductor chip 21 and the second surface 272 of the patterned resist layer 27 are flush with the surface of the encapsulant 22.

Referring to FIG. 2E', the first release layer 200a and the first carrier 20a are removed to expose the active surface 21a of the semiconductor chip 21, a first surface 271 of the patterned resist layer 27 and the encapsulant 22. As such, a package structure of the present invention is obtained.

Therefore, the package structure of the present invention has: an encapsulant 22; at least a semiconductor chip 21 embedded in the encapsulant 22 and having opposite active and inactive surfaces 21a, 21b exposed from the encapsulant 22; and a patterned resist layer 27 embedded in the encapsulant 22 and having opposite first and second surfaces 271, 272 exposed from the encapsulant 22.

Figure 2F:
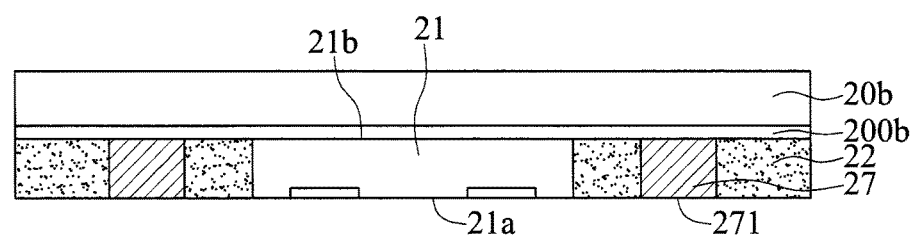

In another embodiment, retelling to FIG. 2F, continued from FIG. 2E, a second carrier 20b having a second release layer 200b formed thereon is provided. The second carrier 20b is disposed on and covers the inactive surface 21b of the semiconductor chip 21, the second surface 272 of the patterned resist layer 27 and the encapsulant 22 through the second release layer 200b. Then, the first carrier 20a and the first release layer 200a are removed to expose the active surface 21a of the semiconductor chip 21, the first surface 271 of the patterned resist layer 27 and the encapsulant 22.

Figure 2G:
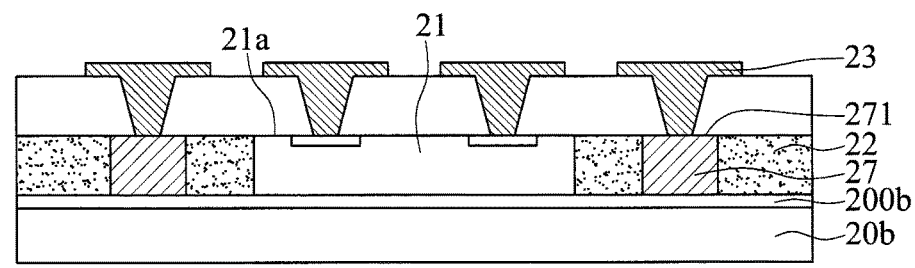

Referring to FIG. 2G, a first redistribution layer 23 is formed on the active surface 21a of the semiconductor chip 21, the first surface 271 of the patterned resist layer 27 and the encapsulant 22. The first redistribution layer 23 is electrically connected to the active surface 21a of the semiconductor chip 21.

Figure 2H:
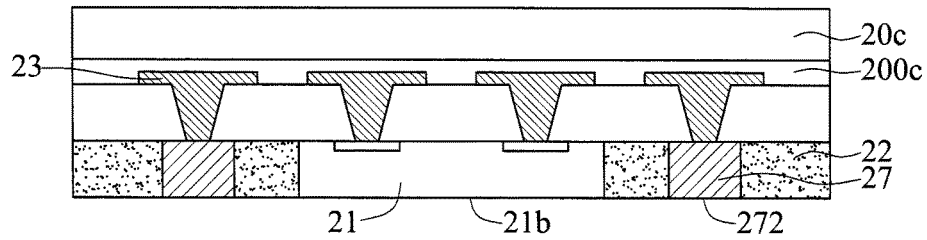

Referring to FIG. 2H, a third carrier 20c having a third release layer 200c is provided. The third carrier 20c is disposed on and covers the first redistribution layer 23 through the third release layer 200c. Then, the second carrier 20b and the second release layer 200b are removed to expose the inactive surface 21b of the semiconductor chip 21, the second surface 272 of the patterned resist layer 27 and the encapsulant 22.

Figure 2I:
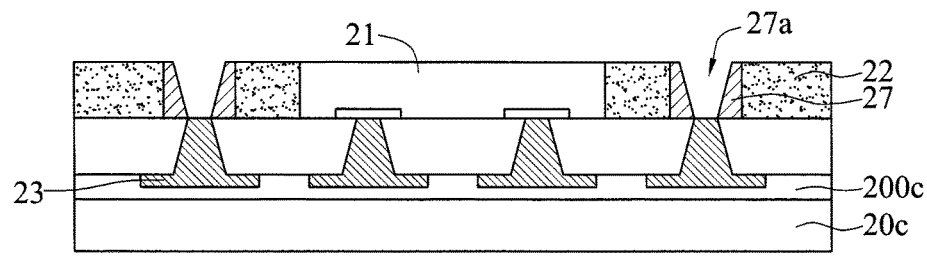

Referring to FIG. 2I, a plurality of through holes 27a are formed in the patterned resist layer 27 by such as laser drilling so as to expose portions of the first redistribution layer 23.

Figure 2J:
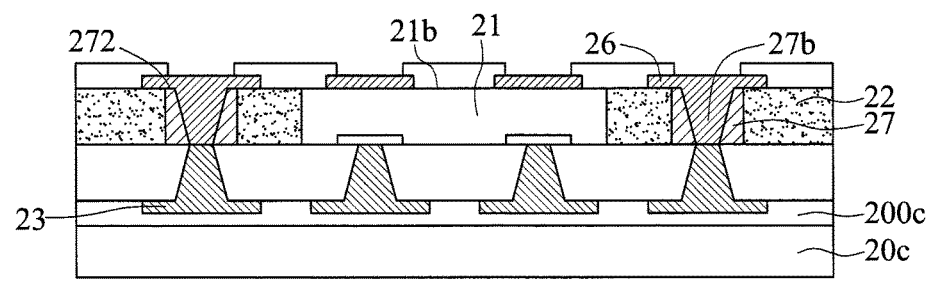

Referring to FIG. 2J, a second redistribution layer 26 is formed on the inactive surface 21b of the semiconductor chip 21, the second surface 272 of the patterned resist layer 27 and the encapsulant 22, and a plurality of conductive through holes 27b are formed in the through holes of the patterned resist layer 27. As such, the second redistribution layer 26 is electrically connected to the first redistribution layer 23 through the conductive through holes 27b.

Figure 2K:
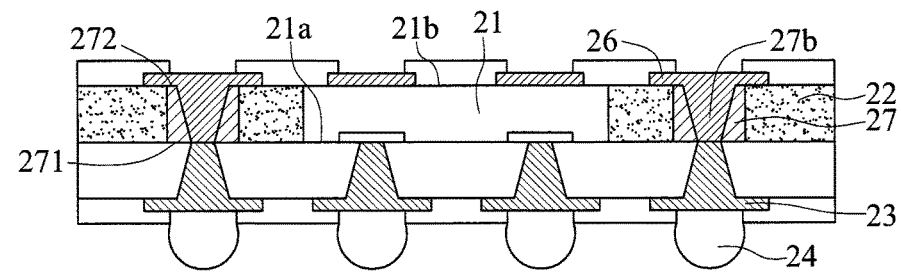

Referring to FIG. 2K, the third carrier 20c and the third release layer 200c are removed, and a plurality of solder balls 24 are formed on the first redistribution layer 23. As such, a package structure according to another embodiment of the present invention is obtained.

Referring to FIG. 2K, the package structure according to another embodiment of the present invention has: an encapsulant 22; a semiconductor chip 21 embedded in the encapsulant 22 and having opposite active and inactive surfaces 21a, 21b exposed from the encapsulant 22; a patterned resist layer 27 embedded in the encapsulant 22 and having opposite first and second surfaces 271, 272 exposed from the encapsulant 22; a plurality of conductive through holes 27b formed in the patterned resist layer 27 and penetrating the first and second surfaces 271, 272 of the patterned resist layer 27; a first redistribution layer 23 formed on the active surface 21a of the semiconductor chip 21, the first surface 271 of the patterned resist layer 27 and the encapsulant 22, wherein the first redistribution layer 23 is electrically connected to the active surface 21a of the semiconductor chip 21; and a second redistribution layer 26 formed on the inactive surface 21b of the semiconductor chip 21, the second surface 272 of the patterned resist layer 27 and the encapsulant 22, wherein the second redistribution layer 26 is electrically connected to the first redistribution layer 23 through the conductive through holes 27b.

Further, a plurality of solder balls 24 are formed on the first redistribution layer so as for the package structure to be stacked on and electrically connected to another package structure.

According to the present invention, the patterned resist layer is formed to partially replace the encapsulant. As such, a plurality of through holes are formed by drilling the patterned resist layer instead of the encapsulant as in the prior art. Therefore, the present invention improves the drilling effect and overcomes the conventional drawback of surface roughness of the through holes caused by filler particles of the encapsulant, thereby facilitating a subsequent electroplating process for forming the conductive through holes in the through holes and improving the electrical reliability.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A package structure, comprising:
   an encapsulant having opposite top and bottom surfaces;
   at least a semiconductor chip embedded in the encapsulant and having opposite active and inactive surfaces exposed from the encapsulant, wherein the inactive surface of the semiconductor chip is flush with the top surface of the encapsulant, and the active surface of the semiconductor chip is flush with the bottom surface of the encapsulant; and
   a patterned resist layer embedded in the encapsulant and having opposite first and second surfaces exposed from the encapsulant, wherein the second surface of the patterned resist layer is flush with the top surface of the encapsulant, and the patterned resist layer is a photoresist layer.

2. The structure of claim 1, further comprising:
   a plurality of conductive through holes formed in the patterned resist layer and penetrating the first and second surfaces of the patterned resist layer;
   a first redistribution layer formed on the active surface of the semiconductor chip, the first surface of the patterned resist layer and the encapsulant, wherein the first redistribution layer is electrically connected to the active surface of the semiconductor chip; and
   a second redistribution layer formed on the inactive surface of the semiconductor chip, the second surface of the patterned resist layer and the encapsulant, wherein the second redistribution layer is electrically connected to the first redistribution layer through the conductive through holes.

3. The structure of claim 1, further comprising a plurality of solder balls formed on the first redistribution layer.

4. The structure of claim 1, wherein the resist layer is a negative photoresist layer.

5. The structure of claim 1, wherein the encapsulant contains filler particles.

\* \* \* \* \*